United States Patent
Roy et al.

(10) Patent No.: US 6,548,422 B1
(45) Date of Patent: Apr. 15, 2003

(54) METHOD AND STRUCTURE FOR OXIDE/ SILICON NITRIDE INTERFACE SUBSTRUCTURE IMPROVEMENTS

(75) Inventors: Pradip K. Roy, Orlando, FL (US); David C. Brady, Windermere, FL (US); Carlos M. Chacon, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/966,779

(22) Filed: Sep. 27, 2001

(51) Int. Cl.⁷ .......................... H01L 23/48; H01L 23/52; H01L 29/40
(52) U.S. Cl. .................. 438/775; 438/770; 438/287
(58) Field of Search ................. 438/216, 287, 438/743, 744, 723, 724, 756, 757, 762, 763, 769, 770, 775, 777, 954

(56) References Cited

U.S. PATENT DOCUMENTS

| | | | |
|---|---|---|---|
| 4,992,306 A | * 2/1991 | Hochberg et al. | 427/255.3 |
| 6,136,654 A | * 10/2000 | Kraft et al. | 438/287 |
| 6,140,187 A | 10/2000 | DeBusk et al. | 438/287 |
| 6,197,701 B1 | * 3/2001 | Shue et al. | 438/763 |

OTHER PUBLICATIONS

U.S. patent application No. 09/481,992, filed Jan. 11, 2000; entitled: Method of Making a Graded Grown, High Quality Oxide Layer for a Semiconductor Device; 30 pages.
U.S. patent application No. 09/597,077, filed Jun. 20, 2000; entitled: High Quality Oxide for Use in Integrated Circuits; 26 pages.
Pradip Kumar Roy, Synthesis of a New Manufacturable High–Quality Graded Gate Oxide for Sub–0.2 cm Technologies, IEEE Transactions on Electron Devices, vol. 48, No. 9, Sep. 2001, pp. 2016–2021.
U.S. patent application No. 09/481,992, filed Jan. 11, 2000; entitled: Method of Making a Graded Grown, High Quality Oxide Layer for a Semiconductor Device; 30 pages.
U.S. patent application No. 09/597,077, filed Jun. 20, 2000; entitled: High Quality Oxide for Use in Integrated Circuits; 2 pages.
Pradip Kumar Roy, Synthesis of a New Manufacturable High–Quality Graded Gate Oxide for Sub–0.2 cm Technologies, IEEE Transactions on Electron Devices, vol. 48, No. 9, Sep. 2001, pp. 2016–2021.

* cited by examiner

Primary Examiner—David Nelms
Assistant Examiner—David Nhu
(74) Attorney, Agent, or Firm—Christie, Parker & Hale, LLP

(57) ABSTRACT

A transistor gate dielectric structure includes an oxide layer formed on a substrate, a superjacent nitride layer and a transition layer interposed therebetween. The presence of the transition layer alleviates stress between the nitride and oxide layers and minimizes any charge trapping sites between the nitride and oxide layers. The transition layer includes both nitrogen and oxygen as components. The method for forming the structure includes forming the transition layer using a remote nitridation reactor at a sufficiently low temperature such that virtually no nitrogen reaches the interface formed between the oxide layer and the substrate. The oxide layer/substrate interface is relatively pristine and defect-free. In an exemplary embodiment, the oxide layer may be a graded structure formed using two distinct processing operations, a first operation at a relatively low temperature and a final operation at a temperature above the viscoelastic temperature of the oxide film.

13 Claims, 2 Drawing Sheets

METHOD AND STRUCTURE FOR OXIDE/ SILICON NITRIDE INTERFACE SUBSTRUCTURE IMPROVEMENTS

FIELD OF THE INVENTION

This invention relates to semiconductor integrated circuit devices, most generally, and the processes for forming such devices. More specifically, this invention relates to the materials, processes, and structures used to form a layered gate dielectric film structure which includes an oxide film, a nitride film, and a transition layer including nitrogen and oxygen which is formed between the oxide and nitride films.

BACKGROUND OF THE INVENTION

Semiconductor integrated circuit devices typically include a thin dielectric material, commonly a thermally grown oxide, which functions as a gate dielectric for transistors incorporated into the semiconductor integrated circuit devices. The gate dielectric material is typically formed on a semiconductor substrate over a region which will serve as a channel region. The transistors function when a channel is formed in the semiconductor substrate beneath the gate dielectric in response to a voltage being applied to a gate electrode formed atop the gate dielectric film. The quality and integrity of the gate dielectric film is critical to the functionality and lifetime of the transistor devices, which include a very tightly defined set of operational characteristics that are very sensitive to the materials and methods used to form the transistor devices. It is important, therefore, to suppress the migration of any undesired dopant species into the gate dielectric film, or through the gate dielectric film and into the subjacent channel region.

Polycrystalline silicon films are commonly used as gate electrode materials for transistors in semiconductor integrated circuits. Polycrystalline silicon may be "n-type" polycrystalline silicon or "p-type" polycrystalline silicon. By "p-type" polycrystalline silicon material, it is meant that a p-type dopant impurity is included in the polycrystalline silicon film, for example. A commonly used and preferred p-type dopant within the semiconductor industry is boron. When boron is used as an impurity dopant within a polycrystalline silicon film, it is of critical significance to maintain the boron within the polycrystalline silicon film, and especially to suppress migration of the boron into or through the gate dielectric film which forms part of the transistor.

After boron is introduced as a dopant impurity into the polycrystalline silicon, however, subsequent high temperature processing operations used to form semiconductor devices can cause boron to diffuse from the polycrystalline silicon and into the gate dielectric material, or through the gate dielectric material and into the channel region of the transistor formed below the gate dielectric region. Boron diffusion occurs during activation processes which utilize temperatures in the range of 950° C. to 1050° C. to activate the boron. Boron diffusion can also occur during other high temperature processing operations or during the operation of the completed device. When boron diffuses into the gate dielectric or the channel region, gate dielectric reliability is degraded and device functionality can be destroyed. It is thus of increased significance to suppress the diffusion of boron or other impurities from the polycrystalline silicon interconnect and gate structures and into and through the gate dielectric films. It is therefore desirable to have a built-in means within the gate electrode/gate dielectric structure to suppress boron diffusion from out of the p-type polycrystalline silicon and into or through the gate dielectric material.

One preferred approach to suppressing boron diffusion as above, is to utilize a layered gate dielectric film which includes an oxide film and a superjacent silicon nitride film. An alternate, but similar approach utilizes an oxide film, a nitride film, and a second oxide film. The combination of an oxide film and a superjacent nitride film to form a gate dielectric may successfully suppress boron penetration from p-type polycrystalline silicon into the underlying channel region or to the interface formed between the subjacent oxide film and the semiconductor substrate surface. In addition, the combination of an oxide and a nitride film to form a gate dielectric also reduces current leakage. However, gate structures which include a silicon nitride layer typically introduce charge trapping problems and channel mobility degradation, as well as drive current reduction. The charge trapping problems typically exist at the abrupt interface formed between the oxide and nitride layers. Such trapped charges are difficult to anneal out. Furthermore, the annealing processes used to attempt to correct the charge trapping problem at the abrupt nitride/ oxide interface typically cause the diffusion of nitrogen and result in nitrogen migrating to the interface between the oxide film and the subjacent semiconductor substrate surface. The presence of nitrogen at this interface also causes charge trapping problems and channel mobility degradation, as well as drive current reduction.

In today's rapidly advancing semiconductor device manufacturing industry, the features of components which form semiconductor integrated circuits, continue to shrink. Consistent with this trend, transistors of increasingly small dimensions are being produced. Accordingly, thinner gate dielectric films are necessary. Such thinner films exacerbate the above problems and create others. For example, when a nitride film having a thickness within the range of 10–50 angstroms is produced according to conventional methods, the film may include pinholes, or small voids. In addition to pinholes and the trap sites which can trap charges and degrade the integrity of the film as described above, the nitride film is typically formed to exert a stress upon the substrate. High film stresses can result in dislocations in the substrate, which lead to drive current reduction and junction leakage.

Because of the above problems associated with boron diffusion, and the shortcomings of contemporary attempts to suppress this diffusion by adding a nitride film into a gate material, there is a demonstrated need in the art to provide a process and structure which includes a nitride gate material which is sufficiently thin and suppresses boron penetration, an oxide/substrate surface interface free of nitrogen or other dopant impurities and the associated charge trapping problems, and a nitride/oxide interface free of charge trapping problems.

SUMMARY OF THE INVENTION

To address these and other needs, and in view of its purposes, the present invention provides a gate structure for a semiconductor transistor formed on a semiconductor surface. The gate structure includes an oxide layer, a nitride layer and a transition layer interposed between the oxide layer and the nitride layer. The thin transition layer, which forms the interface between the oxide and nitride layers, includes both nitrogen and oxygen as components thereof, and provides for a pristine and defect-free interface between the oxide and nitride. The presence of the nitride layer suppresses the undesired diffusion of boron and other dopant impurities.

The present invention also provides a process for forming a transistor gate structure. The process includes forming a thin gate oxide layer. In a preferred embodiment, the thin gate oxide layer may be a graded structure composed of a composite of separately formed oxide layers. A thin transition layer including nitrogen and oxygen is then formed on the gate oxide layer. In an exemplary embodiment, the transition layer may be formed using a remote nitridation reaction and a formation temperature of no greater than 100° C. A silicon nitride layer is then deposited over the transition layer.

The formed gate dielectric structure is substantially free of charge trapping and includes a high-quality interface formed between the oxide and substrate, and a high quality interface formed between the oxide and nitride layers.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures, each of which represents a cross-sectional view.

Like numerals denote like features throughout the specification and claims.

DETAILED DESCRIPTION OF THE INVENTION

The present invention provides a gate structure for a semiconductor transistor formed on a semiconductor surface, and the method for forming the same. The present invention provides a thin gate oxide layer, and a thin silicon nitride film formed over the gate oxide layer. Interposed between the thin gate oxide layer and the silicon nitride film is a transition layer. The transition layer includes nitrogen and oxygen and provides for a low-stress, pristine interface between the oxide layer and the silicon nitride film. The transition layer is preferably formed using a remote plasma nitridation (RPN) reactor. In a preferred embodiment, the gate oxide may be a graded gate oxide layer consisting of two separately formed films. In an exemplary embodiment, the graded gate oxide film may involve the 2-step synthesis of growing an oxide film at a temperature above the viscoelastic temperature of the film, onto a pre-grown low temperature thermally grown $SiO_2$ layer to form the composite graded $SiO_2$ structure. The formed composite gate dielectric structure may include an aggregate thickness of less than 20 angstroms and is therefore suitable for today's sub-micron integration levels.

The structure formed by the method of the present invention provides excellent resistance to boron diffusion and penetration due to the presence of the nitride film. As such, threshold voltage, $V_t$, shifts due to boron penetration, are eliminated. Similarly, gate leakage currents are reduced. The presence of the transition layer and the method used to form the transition layer minimizes fixed charge incorporation at the oxide/nitride interface, which is occupied by the transition layer. The presence of the transition layer also reduces mobility, $G_m$, losses. A transistor formed to include the gate dielectric of the present invention also enjoys enhanced reliability and a low off-state current. Because the transition layer provides a stress-free oxide/nitride interface with minimal or no fixed charge, a subsequent annealing process is not required. Additionally, the low stress of the nitride layer, effectuated by the transition layer formed using RPN techniques, renders a subsequent annealing process not required. As such, the undesirable diffusion effects brought about by annealing processes are obviated.

Figure 1:
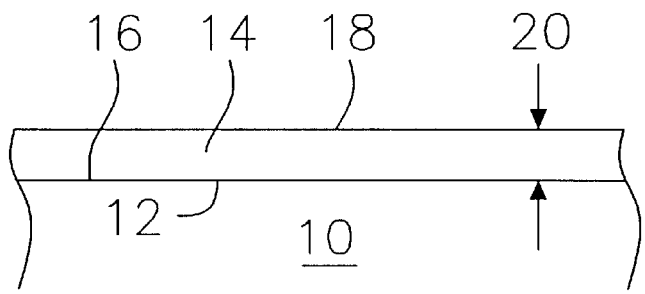
FIG. 1 shows an exemplary gate oxide film formed over a substrate.
Figure 2:
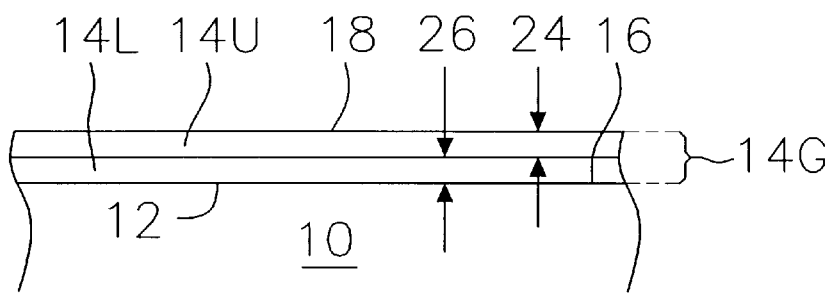
FIG. 2 shows another exemplary gate oxide film, in particular a graded gate oxide film, formed on a substrate.
Figure 3:
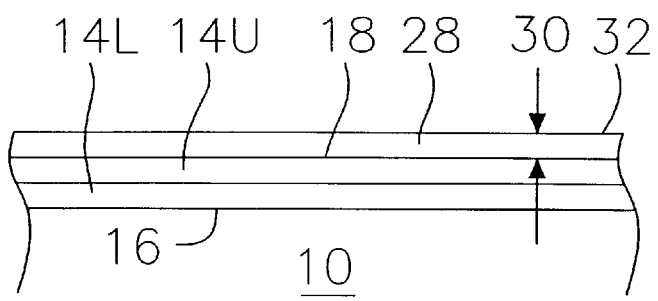
FIG. 3 shows a transition layer formed over the graded gate oxide film such as shown in FIG. 2.

Now turning to the figures, each of FIGS. 1 and 2 are cross-sectional views showing exemplary gate oxide films formed on a substrate. FIGS. 3–6 show a process sequence for forming a transistor gate over the exemplary graded oxide film shown in FIG. 2.

FIG. 1 shows substrate 10, which may be a silicon substrate such as a conventional silicon wafer commonly used in the semiconductor manufacturing industry. According to other exemplary embodiments, substrate 10 may be formed of other materials. Substrate 10 includes an original top surface (not shown) which may be thermally oxidized using various methods to form an oxide layer on substrate 10 which encroaches the original top surface of substrate 10. Exemplary oxide layer 14 may be formed using various suitable methods such as thermal oxidation in a hot wall furnace or using a cold wall rapid thermal oxidation (RTO) system. In an exemplary embodiment, substrate 10 may be silicon and oxide layer 14 may be a silicon dioxide $SiO_2$ film. Oxide layer 14 forms interface 16 with substrate 10 and also includes upper surface 18. Thickness 20 of oxide layer 14 may range from 5–100 angstroms, preferably 5–20 angstroms, but other thicknesses may be used in other exemplary embodiments. Substrate surface 12 is shown to be the uppermost surface of substrate 10 which forms interface 16 with oxide layer 14. In an exemplary embodiment, oxide layer 14 may be used as part of the dielectric layers used in a transistor gate and may alternatively be referred to as gate oxide layer 14. In an exemplary embodiment, oxide layer 14 is a single and continuous silicon dioxide, $SiO_2$ film.

FIG. 2 shows another exemplary embodiment of an oxide layer formed on substrate 10. Oxide layer 14G, shown in FIG. 2, is a composite film formed of upper oxide layer 14U and lower oxide layer 14L. Exemplary oxide layer 14G, shown in FIG. 2, may be considered a graded gate oxide film and may be formed using a 2-step synthesis process, which includes growing an oxide film at a temperature above the viscoelastic temperature ($T_{ve}$) of the film, after a pre-grown low temperature thermally grown $SiO_2$ layer has been formed. In this manner, composite graded $SiO_2$ structure 14G is produced. According to the graded gate oxide embodiment, upper oxide layer 14U is the first formed of the sequentially formed films or the pre-grown $SiO_2$ layer grown at a relatively low temperature and at a temperature below the $SiO_2$ viscoelastic temperature $T_{ve}$(~925° C.). Lower oxide layer 14L is the second of the sequentially formed films and is the film formed at the higher oxidation temperature chosen to be at or above the viscoelastic temperature. An exemplary graded oxidation process sequence includes carrying out a final high temperature oxidation step typically at 940–1050° C. in an extremely diluted oxidizing ambient (less than 0.1% $O_2$) on a pre-grown $SiO_2$ layer thermally grown at a temperature below the viscoelastic temperature. In an exemplary embodiment, the pre-grown $SiO_2$ layer may be grown using a temperature within the range of 750–800° C., but other thermal oxidation temperatures may be used alternatively. In an exemplary embodiment, the pre-grown $SiO_2$ layer 14U may include a thickness 24 within the range of 8–15 angstroms, but otherthicknesses maybe used alternatively. Pre-grown upper oxide layer 14U provides grading and stress relief during the cooling phase. The cooling rate of the second oxidation process used to form lower oxide film 14L is carefully modulated near $T_{ve}$ to enhance growth-induced stress relaxation. The pre-grown oxide layer provides grading and acts as a sink for stress accommodation for the final high-temperature $SiO_2$ film which forms interface 16 with substrate 10. Thickness 26 of lower oxide layer 14L may vary from 5–50 angstroms, most preferably within the range of 5–15 angstroms. The grading and modulated cooling generate a strain-free and planar interface 16 between oxide layer 14G and substrate 10. $Si/SiO_2$ interface 16 is therefore relatively pristine and includes a lowered interface trap density than achievable using conventional technology. Graded oxide film 14G includes upper surface 18. According to other exemplary embodiments, various other processing sequences may be used to form graded oxide layer 14G to include a low stress, and a relatively pristine, defect-free substrate/oxide interface.

Although either of the exemplary single-layered oxide layer 14, shown in FIG. 1, or the graded, composite oxide layer 14G, shown in FIG. 2, may be used as the gate oxide film to be subsequently processed according to the method of the present invention, FIGS. 3–6 illustrate the subsequently deposited film structure formed over exemplary graded oxide layer 14G, shown in FIG. 2.

The present invention provides a nitride layer over the oxide film to suppress boron diffusion and penetration. An advantageous aspect of the present invention is the transition layer 28, shown in FIG. 3, formed between the gate oxide layer and the subsequently formed silicon nitride layer (not shown in FIG. 3). Transition layer 28 includes both oxygen and nitrogen. In one exemplary embodiment, transition layer 28 may be a silicon oxynitride, $SiO_xN_y$, film. According to another exemplary embodiment, transition layer 28 may be a nitrogen-doped silicon dioxide film. Various methods may be used to form transition layer 28, and according to the preferred embodiment, a formation temperature of no greater than 100° C. may be used. According to an exemplary embodiment, the structure shown in FIG. 2, and particularly upper surface 18 of graded oxide layer 14G, may be treated in a remote plasma nitridation (RPN) reactor. Such reactor is preferably maintained under vacuum and exposes upper surface 18 to negatively charged nitrogen, positively charged nitrogen, and/or atomic nitrogen species that penetrate upper surface 18 and transform the silicon dioxide ($SiO_2$) into an oxynitride or nitrogen-doped oxide film. In another exemplary embodiment, the transition layer 28 may be deposited over upper surface 18 as a nitrogen-doped oxide, or silicon oxynitride film. Other films including nitrogen and oxygen may be used alternatively. The atomic nitrogen and its associated ions and cations may be generated by a remote RF device, a remote Electron Cyclotron Resonance (ECR) device, and Inductively Coupled Plasma (ICP) device, a microwave device or any other such device that creates atomic nitrogen and/or positively charged nitrogen and negatively charged nitrogen. Transition layer 28 may be formed to a thickness as low as one angstrom, but other thicknesses ranging up to 10 angstroms may be used. According to other exemplary embodiments, thickness 30 of transition layer 28 may take on other values. According to one exemplary embodiment, the various nitrogen species combine with oxygen included in upper surface 18 of graded oxide layer 14G, to form transition layer 28. Transition layer 28 includes top surface 32.

Figure 4:
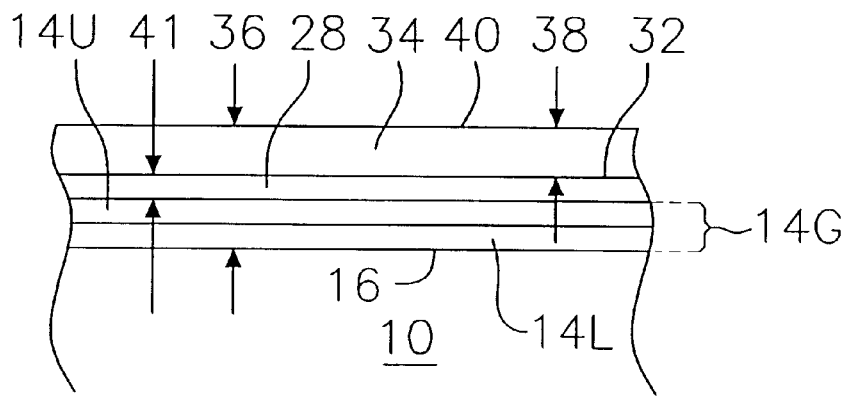
FIG. 4 shows a nitride film formed over the structure shown in FIG. 3.

FIG. 4 shows silicon nitride film 34 formed over transition layer 28. Silicon nitride film 34 includes thickness 38, which may range from 2–100 angstroms, preferably 2–10 angstroms. Silicon nitride film 34 may be formed using low pressure chemical vapor deposition (LPCVD) techniques, but other techniques may be used alternatively. According to exemplary embodiments, a hot wall LPCVD furnace may be used or an LPCVD cold wall rapid thermal reactor may be used at reduced pressure. According to the various exemplary embodiments used to form silicon nitride film 34, the processing conditions are chosen such that substantially no nitrogen reaches interface 16.

According to one exemplary embodiment, the film stack may be formed to include aggregate thickness 36 being less than 20 angstroms, but other film thicknesses may be used alternatively. Silicon nitride film 34 includes upper surface 40. The structure formed according to the method of the present invention includes interface region 41 formed between silicon nitride layer 34 and graded oxide layer 14G, which is substantially defect free. Charge trapping sites and therefore fixed charged is eliminated or minimized at interface region 41, which may be considered to be transition layer 28 and any distinguishable upper and lower surfaces thereof. Transition layer 28 also reduces the stress which silicon nitride film 34 may exert upon graded oxide layer 14G. The composite dielectric structure, shown in FIG. 4, may be used as a gate dielectric for a transistor device. Interface 16 is formed to be virtually free of nitrogen and the charge trapping and mobility problems associated with such presence. In an exemplary embodiment, substrate/oxide interface 16 may include a nitrogen concentration being 0.5% or less, and which does not exceed one atom/$cm^2$. Although the pristine interface—interface region 41 formed to be substantially free of charge trapping defects, obviates the requirement of any subsequent annealing steps, an optional annealing process may subsequently be carried out nonetheless. If such an annealing process is used, the annealing process will be carried out at a temperature of less than 850° C. and using a mild oxidizing gas mixture which may include less than 3% oxygen mixed with an inert gas, in an exemplary embodiment. The optional annealing process may be carried out at any of various subsequent processing points.

Figure 5:
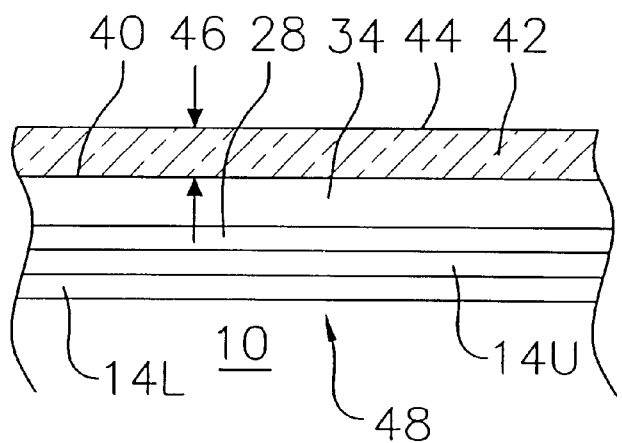
FIG. 5 shows a composite film structure including a gate electrode material formed over the nitride layer shown in FIG. 4.

FIG. 5 shows exemplary gate electrode film 42 formed over silicon nitride film 34. In an exemplary embodiment, gate electrode film 42 may be n-doped or p-doped polycrystalline silicon or a Si-Ge alloy, but other conductive and semiconductor films may be used alternatively. In an exemplary embodiment, gate electrode film 42 may be a p-type material doped with Boron. Gate electrode film 42 includes top surface 44 and thickness 46, which may vary according to device requirements. In a preferred embodiment, the structure shown in FIG. 5 will be used as a gate dielectric/gate electrode for a transistor device to be formed over channel region 48. Conventional methods may be used to subsequently pattern the structure shown in FIG. 5. For example, a photosensitive film may be formed over top surface 44 of gate electrode film 42, and the photosensitive film may then be developed using conventional techniques.

Figure 6:
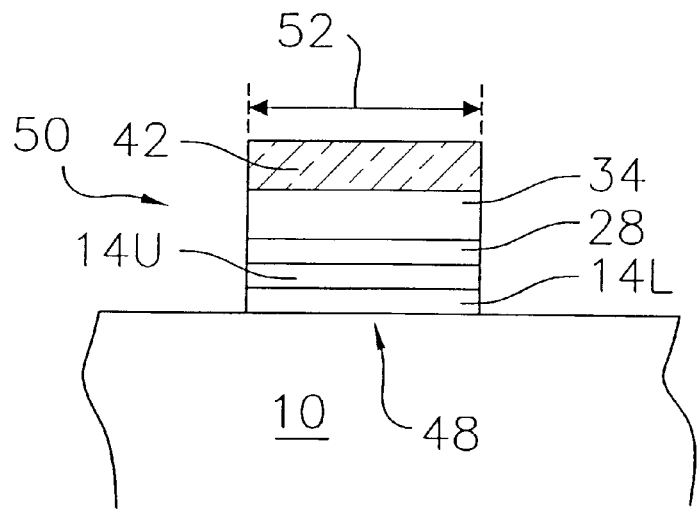
FIG. 6 shows an exemplary gate structure which results after patterning the composite film structure shown in FIG. 5.

The composite film stack may be etched using a sequence of conventional etching operations. Other methods for patterning the structure shown in FIG. 5, may be used alternatively. FIG. 6 shows the composite film structure shown in FIG. 5, after patterning.

Referring to FIG. 6, gate electrode structure 50 include portions of lower oxide layer 14L, upper oxide layer 14U, transition layer 28, silicon nitride film 34, and gate electrode film 42. The structure is formed over channel region 48 and may be used as a transistor gate. Gate width 52 may vary according to various embodiments. The process sequence and structure formed are suitable for transistors having gate widths 52 in the sub-micron range. In an exemplary embodiment, gate width 52 may be less than 0.2 microns and gate structure 50 may be used to form a MOSFET (metal oxide semiconductor field effect transistor).

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A process for forming a semiconductor product comprising the steps of:
   providing a semiconductor substrate having a silicon surface;
   forming an oxide layer over said silicon surface;
   forming a silicon nitride layer over said oxide layer; and
   forming a transition layer including nitrogen and oxygen, between said oxide layer and said silicon nitride layer, by adding nitrogen to an upper surface of said oxide layer, by providing at least one of atomic nitrogen, negatively charged nitrogen, and positively charged nitrogen to penetrate said upper surface and combine with oxygen of said upper surface and form said transition layer.

2. The process as in claim 1, in which said step of forming a transition layer includes a formation temperature of no greater than 100° C.

3. The process as in claim 1, further comprising the step of forming a gate electrode material over said silicon nitride layer.

4. The process as in claim 1, in which said oxide layer, said transition layer, and said silicon nitride layer are formed to an aggregate thickness being no greater than 20 angstroms.

5. A process for forming a semiconductor product comprising the steps of:
   providing a semiconductor substrate having a silicon surface;
   forming an oxide layer over said silicon surface;
   forming a silicon nitride layer over said oxide layer; and
   forming a transition layer including nitrogen and oxygen, between said oxide layer and said silicon nitride layer,
   in which said step of forming a transition layer comprises treating said oxide layer in a remote plasma nitridation reactor.

6. The process as in claim 1, wherein said step of forming a transition layer comprises forming one of a silicon oxynitride layer and a nitrogen-doped oxide layer.

7. The process as in claim 1, wherein said step of forming a transition layer by adding nitrogen to said upper surface thereby transforms said upper surface to one of a silicon oxynitride layer and a nitrogen-doped oxide layer.

8. The process as in claim 1, wherein said at least one of atomic nitrogen, negatively charged nitrogen, and positively charged nitrogen are provided by a remote nitridation source chosen from the group consisting of a radio frequency device, an electron cyclotron resonance device, an inductively coupled plasma device, and a microwave device.

9. The process as in claim 1, wherein said step of forming a silicon nitride layer comprises low pressure chemical vapor deposition (LPCVD).

10. The process as in claim 9, in which said LPCVD process conditions are chosen such that substantially no nitrogen reaches an interface formed between said silicon surface and said oxide layer.

11. The process as in claim 10, wherein said viscoelastic temperature is at least 925° C.

12. The process as in claim 1, in which substantially no nitrogen reaches an interface formed between said silicon surface and said oxide layer during said steps of forming a silicon nitride layer and forming a transition layer.

13. A process for forming a semiconductor product comprising the steps of:
   providing a semiconductor substrate having a silicon surface;
   forming a graded gate oxide layer over said silicon surface by growing a first oxide film at a temperature within the range of 750–800° C., then forming a second oxide film by a thermal oxide growth process which takes place above the viscoelastic temperature of said second oxide film;
   forming a silicon nitride layer over said oxide layer; and
   forming a transition layer including nitrogen and oxygen, between said oxide layer and said silicon nitride layer.

* * * * *